(12) United States Patent
Lillestolen

(10) Patent No.: US 8,397,134 B2
(45) Date of Patent: Mar. 12, 2013

(54) SYSTEM FOR HANDLING OF PERMANENT BIT ERRORS IN MEMORY DEVICES

(75) Inventor: Kirk A. Lillestolen, East Hartland, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 270 days.

(21) Appl. No.: 12/871,070

(22) Filed: Aug. 30, 2010

(65) Prior Publication Data

US 2012/0054570 A1 Mar. 1, 2012

(51) Int. Cl.
*G11C 29/00* (2006.01)
(52) U.S. Cl. .......................... 714/766; 711/104
(58) Field of Classification Search .................. 714/766; 711/104
See application file for complete search history.

(56) References Cited

U.S. PATENT DOCUMENTS

| 4,209,846 A | 6/1980 | Seppa |
| 5,925,138 A | 7/1999 | Klein |

| 2003/0217222 A1 | 11/2003 | Deutscher et al. | |
| 2005/0283566 A1* | 12/2005 | Callaghan | 711/104 |
| 2008/0301529 A1 | 12/2008 | Spanel et al. | |

FOREIGN PATENT DOCUMENTS

| EP | 1811525 A2 | 7/2007 |
| WO | WO2008/061558 A1 | 5/2008 |

OTHER PUBLICATIONS

The extended European Search Report in counterpart European Application No. 11179431.9 filed Aug. 30, 2011.

* cited by examiner

*Primary Examiner* — Sam Rizk
(74) *Attorney, Agent, or Firm* — Kinney & Lange, P.A.

(57) ABSTRACT

A memory system including a primary memory storage partition, a secondary memory storage partition, and a memory controller that is connected to read and write to the primary memory storage partition and detect a permanent bit error at an address associated with the primary memory storage partition. In response to a detected permanent bit error, the memory controller stores data from the address associated with the permanent bit error to an address associated with the secondary memory storage partition.

21 Claims, 5 Drawing Sheets

SYSTEM FOR HANDLING OF PERMANENT BIT ERRORS IN MEMORY DEVICES

BACKGROUND

The present invention is related to error correction in memory systems, and in particular to a system and method for automatically detecting and handling permanent bit errors in memory systems.

Computer systems generally contain, at minimum, a central processing unit and a memory storage device. Memory storage devices are necessary because they provide data retention for the computer system. These memory storage devices are susceptible to data bit errors, especially in environments with high levels of radiation. These bit errors occur when an energized particle, such as a stray neutron, comes into contact with a data bit storage cell and causes the stored data bit to flip from a logic 1 to a logic 0 or vice versa.

Computer systems are usually equipped to detect single or multiple bit errors in the data stored in a memory storage device. These errors can be temporary, such as bit errors caused by a single event upset (SEU), or permanent, such as bit errors caused by single event latchup (SEL) events, which require a reset of power to the memory storage device to fix. An SEU event is caused when an energized particle comes into contact with a data bit storage cell causing the storage cell to change state. An SEU event can be fixed by simply rewriting the correct data to the data bit storage cell. In contrast, an SEL event generally occurs when an energized particle, usually a stray neutron, hits a metal oxide semiconductor field effect transistor (MOSFET) and creates a low-impedance path between the power rails of the transistor causing it to continuously conduct. The transistor remains in this state as long as there is some current flowing through it, which is generally until the power is cycled.

The prior art involves handling permanent bit errors by detecting the error and then automatically recycling power to the device. In flight applications, for example, powering down the latched device requires special circuitry to be added to the power supply to interrupt the input power and to allow the energy in the system to deplete before re-applying the input power. During this period of time, the system must remain offline.

Recycling power to the memory storage device can cause problems in systems that cannot be offline for any extended period of time, such as the systems for an aircraft. Thus, systems that are susceptible to permanent bit errors, particularly in environments that are exposed to high radiation, are required to use memory storage devices that are insulated as to be incapable of permanent bit errors. These memory storage devices are often more expensive than those that are susceptible to permanent bit errors.

SUMMARY

A system and method for automatically detecting and handling permanent bit errors in memory systems. The system includes a primary memory partition, a secondary memory partition, and a memory controller capable of detecting SEL events and redirecting memory requests associated with the address of the event to the secondary memory partition.

DETAILED DESCRIPTION

The present invention describes a memory system that automatically detects and handles permanent bit errors, such as single event latchup (SEL) events, without recycling power. In particular, the system contains a primary memory partition and a secondary memory partition of a memory storage device. The primary partition is used for general memory storage and the secondary partition is used upon detection of a permanent bit error. Upon detection of a permanent bit error, a memory controller redirects all future read and write requests for the address associated with the permanent bit error to the secondary memory partition.

Figure 1:
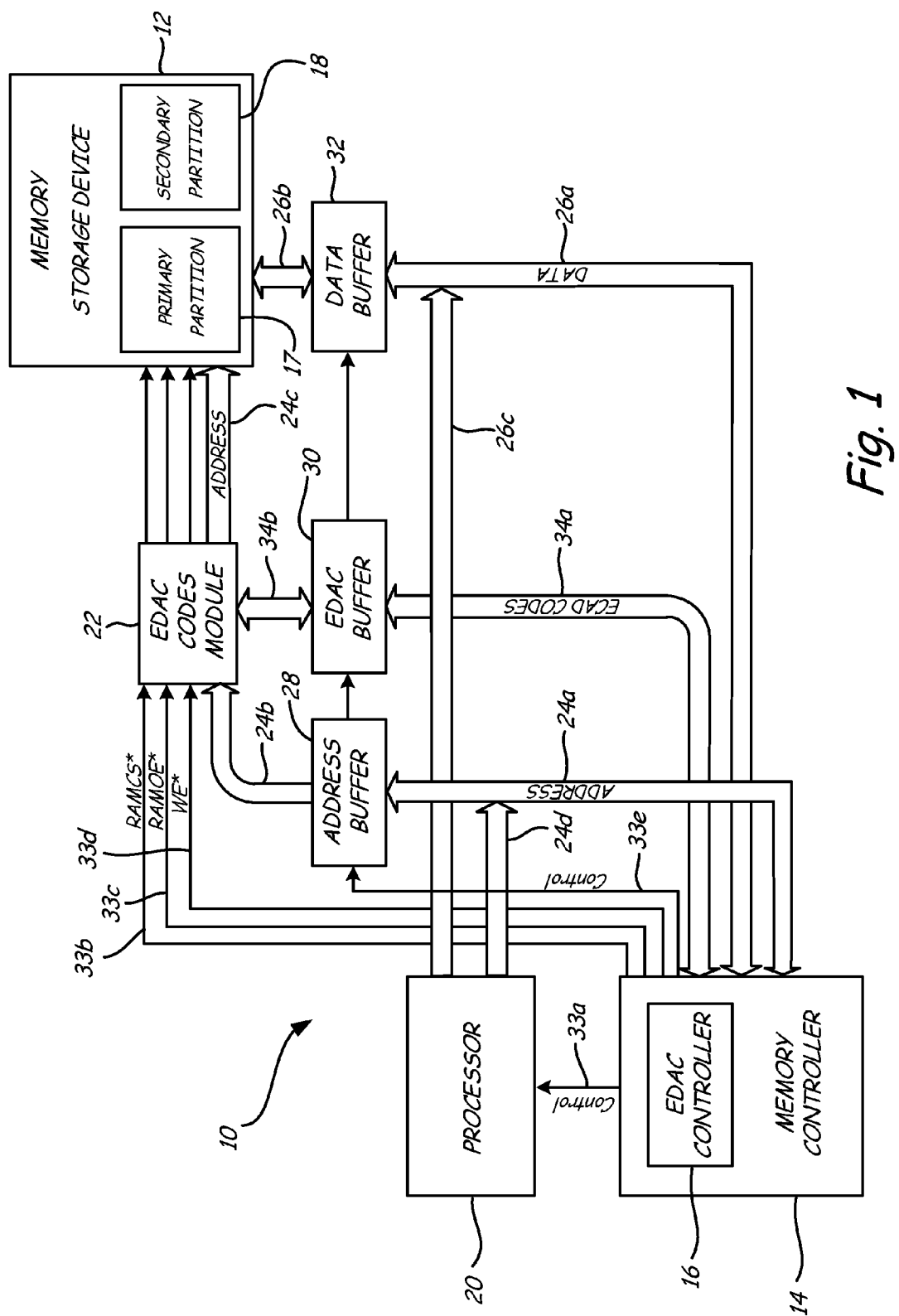
FIG. 1 is a block diagram according to an embodiment of the present invention.

FIG. 1 is a block diagram illustrating an embodiment of memory system 10, which includes memory storage device 12, memory controller 14, error detection and correction (EDAC) controller 16, primary memory storage partition 17, secondary memory storage partition 18, processor 20, EDAC codes module 22, address buses 24a-24d, data buses 26a-26c, address buffer 28, EDAC buffer 30, data buffer 32, control lines 33a-33e, and EDAC buses 34a-34b. EDAC controller 16 is an error detector implemented as a part of memory controller 14. The term 'error detection and correction' (EDAC) refers broadly to a controller or circuit that is capable of identifying errors in transmitted data and/or correcting detected bit errors. For example, in one embodiment an EDAC is capable of detecting single bit errors or multi-bit errors, and may be further capable of correcting single-bit errors and multi-bit errors. Algorithms for detecting and correcting multi-bit errors are typically more computationally expensive than algorithms for detecting and/or correcting single-bit errors. For example, a standard parity algorithm may be employed to detect single bit errors.

Memory controller 14 may be implemented using a field programmable gate array (FPGA), or any other suitable programmable logic device. Address buffer 28, EDAC buffer 30, and data buffer 32 are implemented due to the bidirectional nature of address buses 24a-24d, data buses 26a-26c, and EDAC buses 34a-34b. EDAC codes module 22 is used in conjunction with EDAC controller 16 as part of an EDAC circuit to detect bit errors in memory storage device 12. Control lines 33a-33e are used to allow memory controller 14 to communicate with the rest of memory system 10.

To handle permanent bit errors, memory storage device 12 contains primary memory storage partition 17 and secondary memory storage partition 18. In one embodiment, an operating system running on processor 20 issues read and write requests, which are communicated using address bus 24d and data bus 26c. Before reaching memory storage device 12, the read and write requests pass through memory controller 14. Memory controller 14 has the ability to redirect read and write requests for primary memory partition 17 to secondary memory partition 18 transparent to the operating system running on processor 20. Therefore, the operating system is not required to keep track of both primary memory storage partition 17 and secondary memory storage partition 18. For example, if memory storage device 12 is 4 kilobytes in size, then primary memory storage partition 17 and secondary memory storage partition 18 would each be 2 kilobytes in size. If memory storage device 12 is byte addressable then the operating system running on processor 20 would only be required to know of, and use, 11 address bits to access data in primary memory storage partition 17. Memory controller 14 would use the 12th address bit to select between primary memory storage partition 17 and secondary memory storage partition 18. Memory system 10 can be implemented such that memory controller 14 could use any of the 12 bits as the partition select bit, leaving the operating system to use the remaining 11 bits for addressing, which allows flexibility in how memory storage device 12 is partitioned.

EDAC controller 16 handles detection of single and multiple bit errors in data words stored in memory storage device 12. When data is returned from memory storage device 12, the EDAC controller checks the data for bit errors before returning the data to processor 20. These bit errors can be caused by a non-permanent event, such as an SEU event, or by a permanent event, such as an SEL event. To differentiate between permanent bit errors and non-permanent bit errors, EDAC controller 16 checks to see if a bit error was detected the previous time this address in memory storage device 12 was accessed. If there was not a previous bit error detected, then EDAC controller 16 assumes a non-permanent bit error (i.e. an SEU event) has been detected, provides the operating system running on processor 20, and memory storage device 12 with the corrected data, and flags the address of the non-permanent bit error. The next time there is a read or write request to this address in memory, EDAC controller 16 checks to see if there is still a bit error. If there is no longer a bit error detected for this address, then EDAC controller 16 assumes the previous bit error was a non-permanent bit error and has been corrected. If there is still a bit error detected, then the location in memory storage device 12 is assumed to have a permanent bit error (i.e. an SEL event). EDAC controller 16 then provides processor 20 and secondary memory storage partition 18 with the correct data. EDAC controller 16 also flags the location in primary memory storage partition 17 indicating to memory controller 14 that all future requests for this address should be redirected to secondary memory storage partition 18 of memory storage device 12. This redirection by memory controller 14 continues until the system is powered down.

Figure 2A:
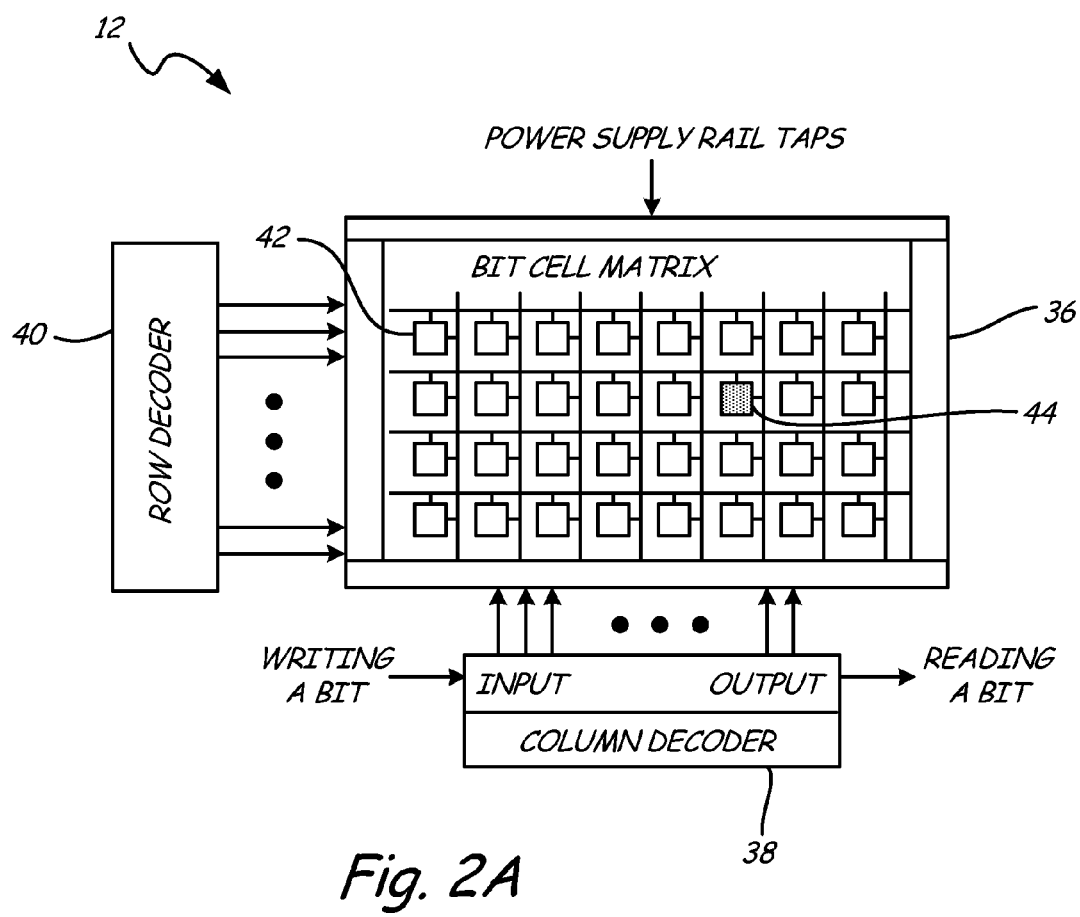
FIGS. 2A-2C are block diagrams illustrating addressing of data bits in a memory storage device according to embodiments of the present invention.

FIG. 2A is a diagram illustrating an embodiment of memory block 36 contained in memory storage device 12. The rows and columns of memory block 36 are composed of data storage bit cells 42. Cells 42 may be made up of one or more MOSFET transistors (not shown). Column decoder 38 and row decoder 40 are used to access data from the bit cells, for example, from cell 44.

Figure 2B:
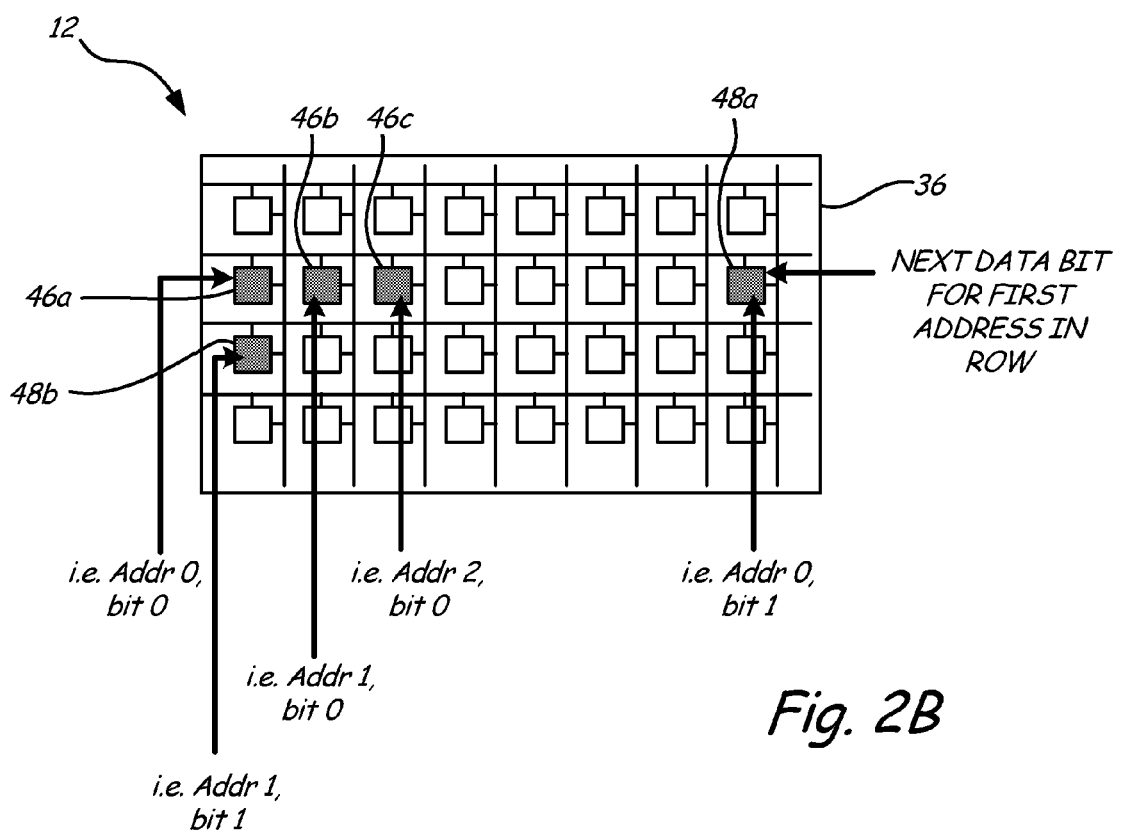

FIG. 2B is a diagram showing an embodiment of an addressing scheme for memory block 36 of memory storage device 12. In this embodiment, data words have a length of seven bits. Cells 42 are arranged such that each bit of a data word is separated by the length of the data word. Having the data bits addressed in this way is advantageous because single bit errors in data words are easier to handle than multiple bit errors. Energized particles can hit a cell 42 and cause a cascading effect, flipping bits in multiple adjacent cells which, in systems not addressed according to the current embodiment, increases the chances of having multiple bit errors in data words. For example, cell 46a corresponds to address 0, bit 0, cell 46b corresponds to address 1, bit 0, cell 46c corresponds to address 2, bit 0, cell 48a corresponds to address 0, bit 1, and cell 48b corresponds to address 1, bit 1, physically separating the data bits corresponding to the same address by the length of the data word, which protects against multiple bit errors.

Figure 2C:
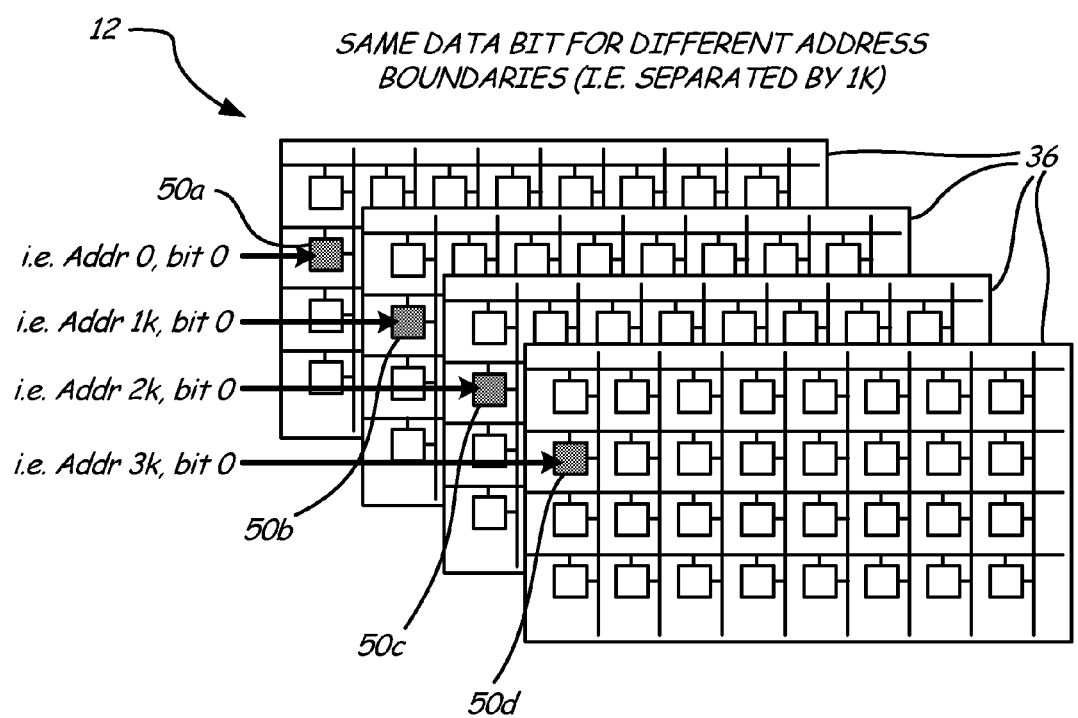

FIG. 2C is a diagram illustrating multiple memory blocks 36 in a memory storage device 12. Memory storage device 12 may be implemented such that data bit storage cells 42 are adjacent not only in the horizontal direction, but in the vertical direction as well. In this embodiment, bit cells may be arranged such that adjacent cells 50a-50d are separated in the vertical direction by a fixed address differential. Vertically adjacent cells 50a-50d can be affected in the same way that horizontally adjacent cells 46a-46c are affected by an energized particle. Thus, memory storage device 12 should be partitioned such that corresponding addresses in primary memory storage partition 17 and secondary memory storage partition 18 are not vertically adjacent. This will help protect against an energized particle creating bit errors occurring for the same data word in primary memory storage partition 17 and secondary memory storage partition 18.

Figure 3:
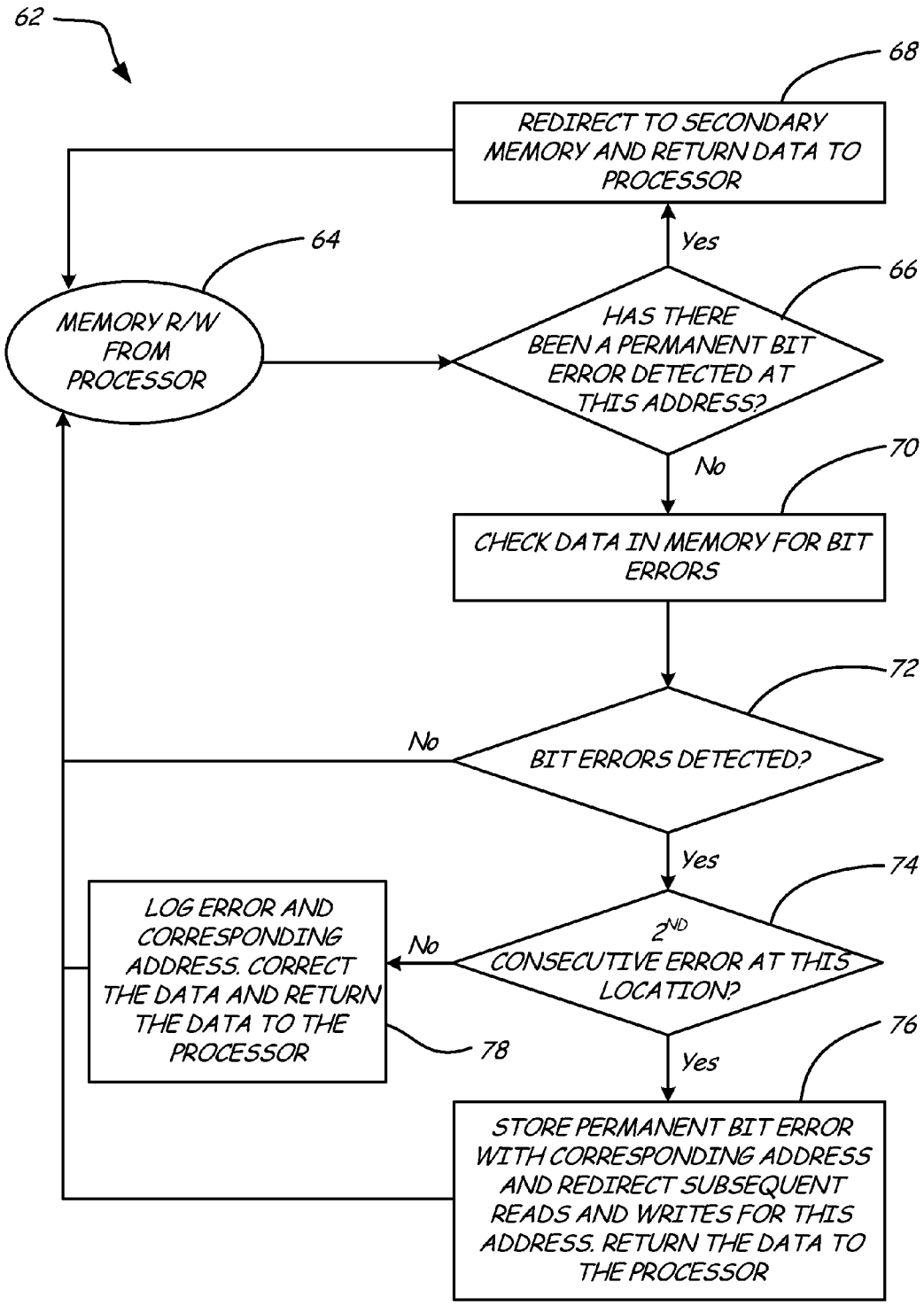
FIG. 3 is a flowchart illustrating a method of detecting and handling permanent bit errors in memory storage devices according to an embodiment of the present invention.

FIG. 3 is a flowchart illustrating a detailed method 62 of detecting and handling permanent bit errors in memory storage devices according to an embodiment of the present invention. At step 64, processor 20 issues a read or a write request on address bus 24d and data bus 26c. At step 66, EDAC controller 16 determines whether there has been a previous permanent bit error detected at the address associated with the read or write request. At step 68, if there has been a previous permanent bit error detected, then the read or write request is redirected by memory controller 14 to secondary memory storage partition 18 of memory storage device 12 and the data is returned to the processor 20. At step 70, if there has not been a previous permanent bit error detected at this address, then EDAC controller 16 checks the data stored in primary memory storage partition 17 of data storage device 12 for single or multiple bit errors. At step 72, if there are no bit errors detected, then the correct data is simply returned to processor 20. At step 74, if there is a bit error detected then EDAC controller 16 determines if this is the second consecutive bit error detected for this location in primary memory storage partition 17 of memory storage device 12. At step 78, if this is not the second error at this location, then EDAC controller 16 corrects the data in memory storage device 12, returns the corrected data to processor 20, and logs the address associated with the bit error. At step 76, if this is the second consecutive error at this location, EDAC controller 16 logs this address as having a permanent bit error, returns the corrected data to processor 20, and memory controller 14 redirects all future read and write requests for this location to a corresponding location in secondary memory storage partition 18 of memory storage device 12.

In this way, the present invention provides a system and method for detecting and handling permanent bit errors in memory storage devices that does not require a recycling of power to the memory storage device. Although the present invention has been described with reference to preferred embodiments, workers skilled in the art will recognize that changes may be made in form and detail without departing from the spirit and scope of the invention. For instance, in FIG. 1, memory storage device 12 may be implemented using a static random access memory device, a dynamic random access memory device, or any other device susceptible to permanent bit errors.

The invention claimed is:

1. A memory system comprising:
    a memory storage device having a primary memory storage partition and a secondary memory storage partition; and
    a memory controller connected to read and write data to the memory storage device, the memory controller configured to detect bit errors and distinguish between non-permanent and permanent bit errors;
    wherein the memory controller, in response to a detected permanent bit error at an address associated with the primary memory storage partition, stores data from the address associated with the primary memory storage partition to an address associated with the secondary memory storage partition and redirects all subsequent data requests for the address associated with the primary memory storage partition to the address associated with the secondary memory storage partition; and wherein the address associated with the primary memory storage partition corresponds to the address associated with the secondary memory storage partition except for a single bit, wherein the memory controller uses the single bit to select between the primary memory storage partition and the secondary memory storage partition.

2. The system of claim 1, wherein the memory controller includes an error detection and correction (EDAC) controller for detecting bit errors in data read from the memory storage device.

3. The system of claim 2, wherein in response to a detected bit error by the EDAC controller, the memory controller stores an address associated with the detected bit error.

4. The system of claim 3, wherein the memory controller identifies a bit error detected by the EDAC controller as a permanent bit error if the address associated with the detected bit error was previously stored by the memory controller as associated with a detected bit error.

5. The system of claim 4, wherein the memory controller removes a stored address associated with a detected bit error if no errors are detected in a subsequent read/write operation associated with that address.

6. The system of claim 1, wherein the primary memory storage partition and the secondary memory storage partition are implemented as logical partitions on a single memory storage device.

7. The system of claim 6, wherein corresponding addresses in the primary memory storage partition and the secondary memory storage partition are not vertically adjacent to one another in the single memory storage device.

8. The system of claim 1, wherein the secondary memory storage partition is invisible to a processor issuing read and write requests to the primary memory storage partition.

9. A method for detecting and handling permanent bit errors in a memory storage device having a primary memory storage partition for storing data and a secondary memory storage partition, the method comprising:
    detecting a bit error at an address associated with the primary memory storage partition;
    distinguishing between a non-permanent bit error and a permanent bit error;
    storing data associated with a detected permanent bit error to the secondary memory storage partition; and
    directing subsequent read and write operations for the address associated with the primary memory storage partition to an address associated with the secondary memory storage partition, wherein the address associated with the primary memory storage partition corresponds to the address associated with the secondary memory storage partition except for a single bit, wherein the memory controller uses the single bit to select between the primary memory storage partition and the secondary memory storage partition.

10. The method of claim 9, wherein distinguishing between a non-permanent bit error and a permanent bit error includes:
    detecting a bit error at an address associated with the primary memory storage partition;
    correcting data at the address associated with the detected bit error;
    storing the address associated with the bit error detected in the primary memory storage partition; and
    detecting a permanent bit error at the address associated with the primary memory storage partition if a successive bit error is detected at the stored address.

11. The method of claim 9, wherein the primary memory storage partition and the secondary memory storage partition are implemented as logical partitions on a single memory storage device.

12. The method of claim 11, wherein the single memory storage device comprises a static random access memory device.

13. The method of claim 9, wherein directing subsequent read and write operations is invisible to a processor issuing data requests to the primary memory storage partition.

14. A permanent bit error detection and handling circuit comprising:
    a primary memory storage partition;
    a secondary memory storage partition;
    an error detector for detecting bit errors in data in the primary memory storage partition; and
    a controller for distinguishing between non-permanent bit errors and permanent bit errors at an address associated with the primary memory storage partition, storing data from the address associated with the primary memory storage partition to the secondary memory storage partition and redirecting subsequent data requests for the address associated with the primary memory storage partition to the address associated with the secondary memory storage partition; and
    wherein the address associated with the primary memory storage partition corresponds to the address associated with the secondary memory storage partition except for a single bit, wherein the memory controller uses the single bit to select between the primary memory storage partition and the secondary memory storage partition.

15. The fault detection and handling circuit of claim 14, wherein the error detector includes an error detection and correction (EDAC) circuit that detects and corrects bit errors in the primary and secondary memory storage partitions.

16. The fault detection and handling circuit of claim 15, wherein in response to a detected bit error by the error detector, the controller stores an address associated with the detected bit error.

17. The fault detection and handling circuit of claim 16, wherein the controller identifies a bit error detected by the error detector as a permanent error if the address associated with the detected bit error was previously stored by the controller.

18. The fault detection and handling circuit of claim 17, wherein the controller removes a stored address associated with a detected bit error if no errors are detected in a subsequent read/write operation associated with the address.

19. The fault detection and handling circuit of claim 15, wherein the primary memory storage partition and the secondary memory storage partition are implemented as logical partitions on a single memory storage device.

20. The system of claim 19, wherein corresponding addresses in the primary memory storage partition and the secondary memory storage partition are not vertically adjacent to one another in the single memory storage device.

21. The fault detection and handling circuit of claim 19, wherein the single memory storage device comprises a static random access memory device.

* * * * *